(12) United States Patent
Sugawara et al.

(10) Patent No.: US 6,519,123 B1
(45) Date of Patent: Feb. 11, 2003

(54) METHOD TO MANUFACTURE MAGNETIC TUNNELING ELEMENTS USING INDUCTIVELY COUPLED PLASMA

(75) Inventors: Junichi Sugawara, Miyagi (JP); Eiji Nakashio, Miyagi (JP); Seiji Kumagai, Miyagi (JP); Yoshito Ikeda, Tochigi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/392,554

(22) Filed: Sep. 9, 1999

(30) Foreign Application Priority Data

Sep. 17, 1998 (JP) .......................... 10-263695

(51) Int. Cl.⁷ .............................................. G11B 5/139
(52) U.S. Cl. ................................................ 360/324.2
(58) Field of Search ..................................... 360/324.2

(56) References Cited

U.S. PATENT DOCUMENTS

| | | | |
|---|---|---|---|
| 4,548,834 A | * 10/1985 | Tsuge et al. | ............... 216/3 |
| 5,764,567 A | 6/1998 | Parkin | ............... 365/173 |
| 5,999,379 A | * 12/1999 | Hsiao et al. | ............... 360/320 |
| 6,125,062 A | * 9/2000 | Ahn et al. | ............... 365/189.07 |

FOREIGN PATENT DOCUMENTS

EP     0 648 069 B1     4/1995

OTHER PUBLICATIONS

M. Sato, et al., *Giant magnetoresistance in Ni–Fe/Co/Al–AlOx/Co/Ni–Fe/Fe–Mn ferromagnetic tunnel junctions*, Fujitsu Scientific & Technical Journal, 'Online', vol. 34, No. 2, Dec. 1998, pp. 204–211, XP002128633.

Patent Abstracts of Japan, vol. 1998, No. 13, Nov. 30, 1998 & JP10–221557A, (Sumitomo Electric Ind. Ltd.), Aug. 21, 1998.

* cited by examiner

*Primary Examiner*—George J. Letscher
(74) *Attorney, Agent, or Firm*—Sonnenschein, Nath & Rosenthal

(57) ABSTRACT

A magnetic tunneling element in which the tunnel current flows reliably to exhibit a stable magnetic tunneling effect. The magnetic tunneling element includes a first magnetic layer, a tunnel barrier layer formed on the first magnetic layer, and a second magnetic layer formed on the tunnel barrier layer. The tunnel barrier layer is a metal film oxidized by inductively coupled oxygen plasma and a second magnetic layer is formed on the tunnel barrier layer.

12 Claims, 9 Drawing Sheets

METHOD TO MANUFACTURE MAGNETIC TUNNELING ELEMENTS USING INDUCTIVELY COUPLED PLASMA

RELATED APPLICATION DATA

The present application claims priority to Japanese Application No. P10-263695 filed Sep. 17, 1998 which application is incorporated herein by reference to the extent permitted by law.

BACKGROUND OF THE INVENTION

1. Field of the Invention

This invention relates to a magnetic tunnelling element in which a pair of magnetic layers are laminated via a tunnel barrier layer and in which the tunnel current flows from one to the other magnetic layer, with the conductance of the tunnel current being changed in dependence upon the relative angle of magnetization of the paired magnetic layers. This invention also relates to a method for manufacturing the magnetic tunnelling element.

2. Description of the Related Art

It has been reported that, if, in a layered structure comprised of a thin insulating layer sandwiched between a pair of magnetic metal layers, a pre-set voltage is applied across the paired magnetic metal layers as electrodes, a magnetic tunnelling effect is produced, in which the conductance of the tunnel current flowing through the insulating layer is changed in dependence upon the relative angle of magnetization of the paired magnetic metal layers. That is, a layered structure comprised of a thin insulating layer sandwiched between a pair of magnetic metal layers exhibits a magnetoresistance effect with respect to the tunnel current flowing through the insulating layer.

In this magnetic tunnelling effect, the specific magnetoresistance ratio can be theoretically calculated based on the spin of polarization of the paired magnetic metal layers. In particular, if Fe is used as the material of the paired magnetic metal layers, expectation may be made of the specific magnetoresistance ratio of approximately 40%.

Therefore, a magnetic tunnelling element having a layered structure comprised of a thin insulating layer sandwiched between paired magnetic metal layers is stirring up notice as an element for detecting an external magnetic field.

In the above-described magnetic tunnelling element, an oxidized metal is usually used as the thin insulating layer. However, if a metal oxide is used as an insulating layer, pinholes etc tend to be formed, such that short circuit tends to be induced between the paired magnetic metal layers. There are occasions wherein, if a metal oxide is used as an insulating layer, the metal oxidation degree is insufficient, such that the tunnel barrier is incomplete and the magnetic tunnelling effect is not showed.

SUMMARY OF THE INVENTION

It is therefore an object of the present invention to provide a magnetic tunnelling element through which the tunnel current flows positively in the insulating layer to exhibit the magnetic tunnelling effect in stability.

In one aspect, the present invention provides a magnetic tunnelling element including a first magnetic layer, a tunnel barrier layer formed on the first. magnetic layer, and a second magnetic layer formed on the tunnel barrier layer. The tunnel barrier layer is formed by oxidization of a metal film using an inductively coupled oxygen plasma.

The magnetic tunnelling element according to the present invention has a tunnel barrier layer which is formed by oxidization of a metal film using an inductively coupled oxygen plasma. Thus, the tunnel barrier layer is able to insulate the first magnetic layer reliably from the second magnetic layer in a manner free from defects.

In another one aspect, the present invention provides a method for manufacturing a magnetic tunnelling element including forming a first magnetic layer, oxidizing a metal film by an inductively coupled oxygen plasma for forming a tunnel barrier layer on the first magnetic layer, and forming a second magnetic layer on the first magnetic layer via the tunnel barrier layer.

In the manufacturing method for the magnetic tunnelling element according to the present invention, the metal layer is an inductively coupled oxygen plasma, in forming the tunnel barrier layer. Thus, with this technique, the metal layer can be oxidized without sputtering. Therefore, with this technique, the tunnel barrier layer can be formed which is able to insulate the first magnetic layer reliably from the second magnetic layer without damaging the metal film.

In particular, with the magnetic tunnelling element according to the present invention, the metal film is oxidized with an inductively coupled oxygen plasma to form the tunnel barrier layer. Thus, with the present magnetic tunnelling element, the first magnetic layer can be insulated reliably from the second magnetic layer without producing short circuit. Therefore, with the present magnetic tunnelling element, the tunnel current is allowed to flow reliably between the first and second magnetic films.

Also, with the manufacturing method for the magnetic tunnelling element according to the present invention, the tunnel barrier layer can be formed by oxidization of a metal film using an inductively coupled oxygen plasma. Thus, with the present technique, the tunnel barrier layer can be formed which reliably insulates the first magnetic layer from the second magnetic layer without damaging the metal film, so that it becomes possible to prevent malfunctions such as short circuit between the first magnetic layer and the second magnetic layer to improve the productivity significantly.

DESCRIPTION OF THE PREFERRED EMBODIMENTS

Figure 1:
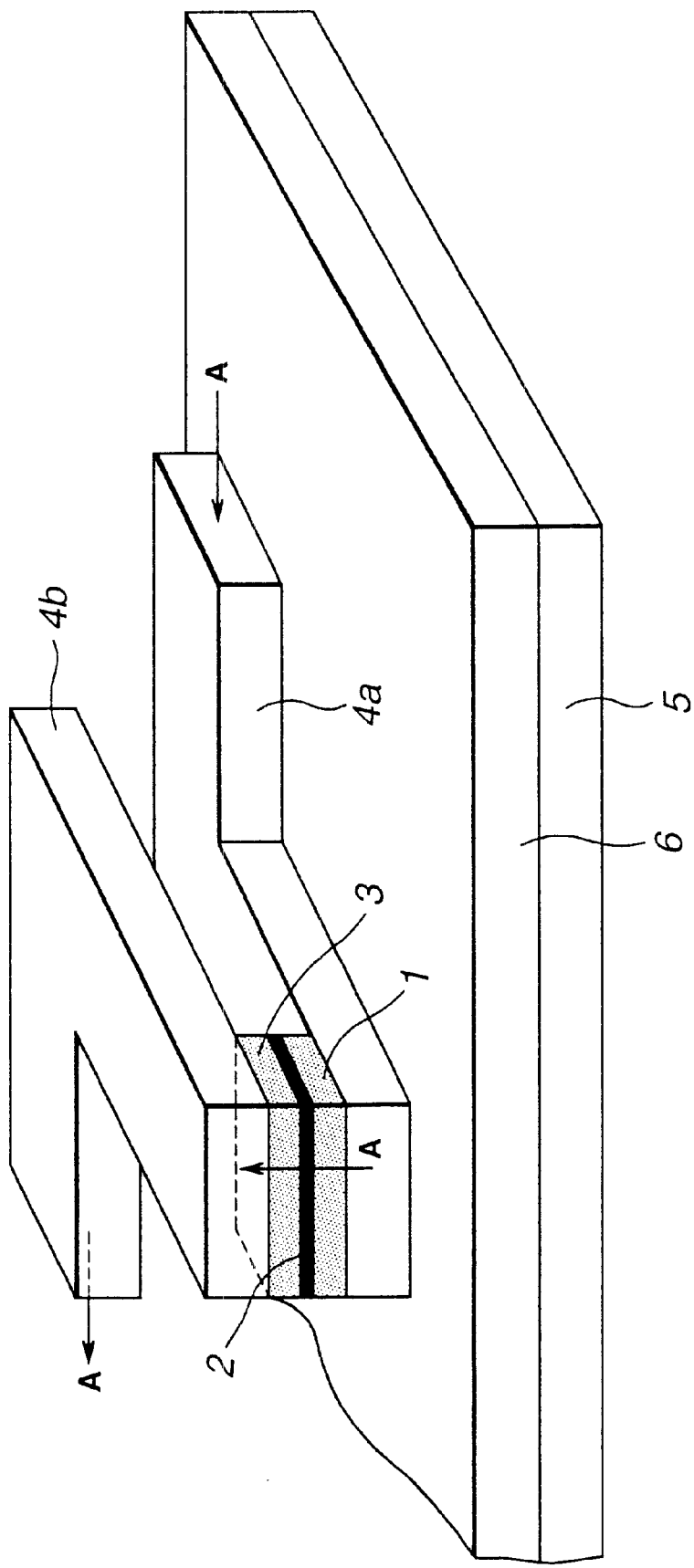
FIG. 1 is a schematic perspective view showing a magnetic tunnelling element according to the present invention.

Referring to the drawings, preferred embodiments of a magnetic tunnelling element and a manufacturing method therefor according to the present invention will be explained in detail.

A magnetic tunnelling element, embodying the present invention, is made up of a first magnetic metal layer 1, a tunnel barrier layer 2, formed overlying the first magnetic metal layer 1, and a second magnetic metal layer 3, formed on the tunnel barrier layer 2 for facing the first magnetic metal layer 1. To the first magnetic metal layer 1 and the second magnetic metal layer 3 are connected a first electrode 4a and a second electrode 4b, respectively.

In this magnetic tunnelling element, a layered unit comprised of a substrate 5 of, for example, Si, having a planar surface, and an insulating layer 6 of, for example, $SiO^2$, is used as a substrate. Therefore, the first electrode 4a is formed on the insulating layer 6 of this substrate.

In this magnetic tunnelling element, the first magnetic metal layer 1 has a free magnetization film for changing the direction of magnetization of the external magnetic field, whilst the second magnetic metal layer has joined magnetization layer not changing the direction of magnetization of the external magnetic field.

Figure 2:
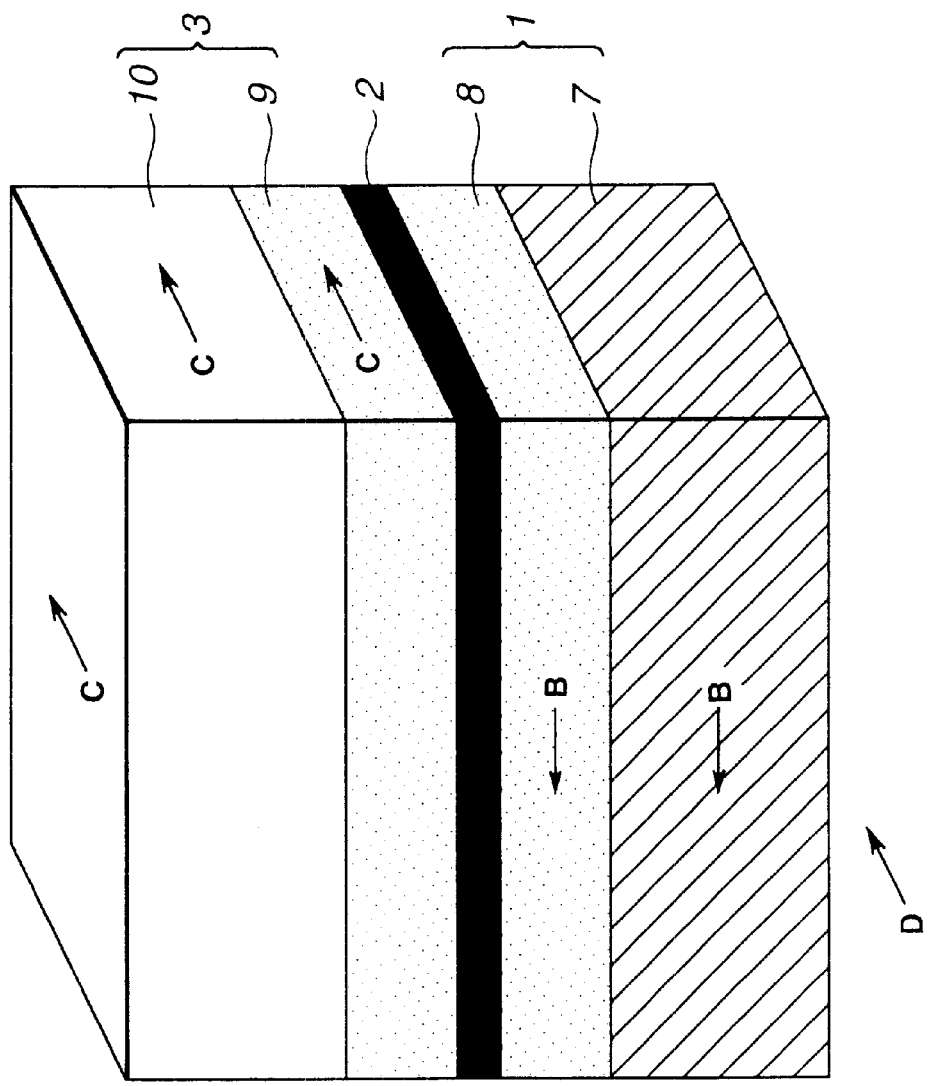
FIG. 2 is a cross-sectional perspective view showing essential portions of the magnetic tunnelling element according to the present invention.

This first magnetic metal layer 1 is of a dual layer structure comprised of a NiFe layer 7 and a Co layer 8, sequentially layered from the side of the first electrode layer 4a, as shown in FIG. 2. The second magnetic metal layer 3 is of a dual layer structure comprised of a Co layer 9 and an IrMn layer 10, sequentially layered from the side of the tunnel barrier layer 2.

Specifically, the NiFe layer 7 in the first magnetic metal layer 1 is a free magnetization layer of low coercivity the direction of magnetization of which is changed with respect to the external magnetic field. In this first magnetic metal layer 1, the Co layer 8 is arranged for realizing high spin polarization in the junction interface along with the Co layer 9 as later explained. That is, by arranging the Co layer 8 and the Co layer 9 in an interface between the NiFe layer 7 and the tunnel barrier layer 2 and in an interface between the IrMn layer 10 and the tunnel barrier layer 2, respectively, it is possible to increase the specific magnetoresistance ratio of the magnetic tunnelling element.

In this magnetic tunnelling element, the NiFe layer 7 is formed to a film thickness of approximately 18.8 nm, while the Co layer 8 is formed to a film thickness of approximately 3.9 nm. The NiFe layer 7 and the Co layer 8 are formed by sputtering to a strip shape.

The tunnel barrier layer 2 is formed by oxidization of a metal film using an inductively coupled oxygen plasma. For this metal film, metals such as Al, Gd, Hf, Fe, Co, Ni, Se or Mg are used. In addition; for the tunnel barrier layer 2, any suitable oxidixed metals that prove a tunnel barrier flowed the tunnelling current is used.

In this technique, an inductively oxygen plasma 12 is generated by the high frequency induction coupling system by introducing an oxygen gas into a chamber 10 and by applying a ration frequency power to a coil 11. A metal film 13 arranged facing the coil 11 is oxidized by the oxygen plasma 12. In this technique, since no voltage is applied to the metal film 13 itself, arranged in the chamber 10, the metal film 13 can be prevented from being etched at the time of its oxidation. Thus, with this technique, the tunnel barrier layer 2 can be reliably formed without damaging the metal film 13.

Moreover, in the second magnetic metal layer 3, the IrMn layer 10 is of an anti-ferromagnetic material, and has exchanged with the Co layer 9 to set the magnetization of the Co layer 9 in a predetermined direction. That is, in this magnetic tunnelling element, the Co layer 9 proves an immobilized magnetized layer having pinned magnetization in a predetermined direction, while also proving a layer arranged for improving the specific magnetoresistance ratio. It is noted that an cupping layer of, for example, Ta, may be formed in this second magnetic metal layer 3 for preventing corrosion of the IrMn layer 10.

Specifically, the Co layer 9 in the second magnetic metal layer 3 is formed to a film thickness of approximately 5 nm, while the IrMn layer 10 is formed to film thickness of approximately 15 nm. The Co layer 9 and the IrMn layer 10 are sequentially formed by sputtering using a metal mask.

In the above-described magnetic tunnelling element, according to the present invention, a predetermined voltage is applied across the first magnetic metal layer 1 and the second magnetic metal layer 3. Thus, in this magnetic tunnelling element, electrons are moved from the first magnetic metal layer 1 to the second magnetic metal layer 3, as indicated by arrow A in FIG. 1, thus allowing for flow of the tunnel current.

In the above-described magnetic tunnelling element, described above, the NiFe layer 7 of the first magnetic metal layer 1 is the free magnetization film, the direction of magnetization of which can be freely changed with respect to the external magnetic field. Specifically, the NiFe layer 7, which is the free magnetization film, is formed to have uniaxial directional anisotropy in the direction indicated by arrow B in FIG. 2, whilst the Co layer 9, which is the pinned magnetization film, is exchange-coupled to the IrMn layer 10 of an anti-ferromagnetic material, and has pinned magnetization in the direction indicated by arrow C in FIG. 2. Therefore, in the absence of the external magnetic field, the direction of magnetization of the NiFe layer 7 substantially crosses that of the Co layer 9.

If, in this state, the external magnetic field is applied along the direction indicated by arrow C in FIG. 2, the direction of magnetization of the NiFe layer 7 is changed so as to have a predetermined angle with respect to that of the Co layer 9. In this magnetic tunnelling element, the resistance value to the tunnel current is determined in dependence upon the relative angle between the direction of magnetization of the NiFe layer 7 and that of the Co layer 9. Thus, if the external magnetic field is applied, as described above, the resistance value to the tunnel current is changed, so that, in this magnetic tunnelling element, the external magnetic field can be detected by measuring the resistance value of the tunnel current.

Figure 4:
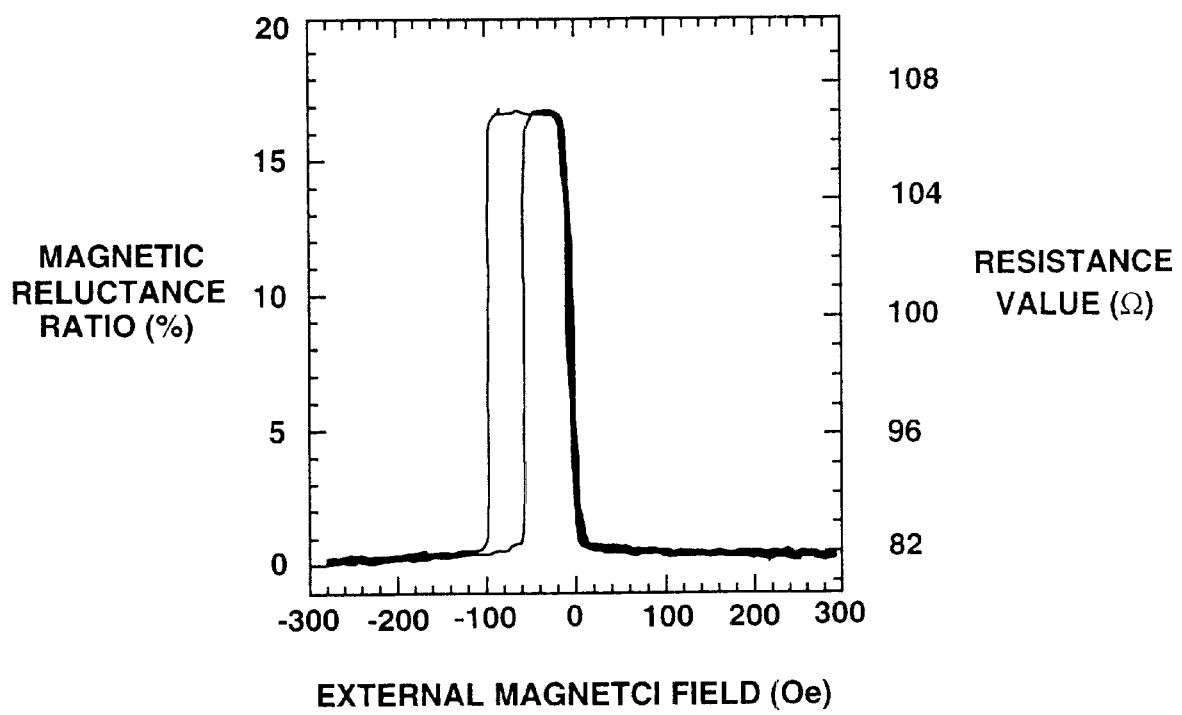
FIG. 4 is a graph showing the relation between the external magnetic field, resistance value and the magnetoresistence ratio in the magnetic tunnelling element according to the present invention.

Meanwhile, in this magnetic tunnelling element, the metal film is oxidized, using the inductively coupled oxygen plasma to form the tunnel barrier layer 2. Thus, with this magnetic tunnelling element, the tunnel current flows positively between the first magnetic metal layer 1 and the second magnetic metal layer 3, as shown in FIG. 4. Stated differently, the tunnel barrier layer 2 can be formed reliably with the above-described technique, thus preventing malfunctions of the current flowing between the first magnetic metal layer 1 and the second magnetic metal layer 3 to improve the yield significantly.

For verification, magnetic tunnelling elements were prepared using the, above-described technique, the technique of oxidizing the metal film by natural oxidation in atmosphere and the technique of oxidizing the metal film by plasma oxidation, and respective yields of the produced elements were measured.

In the above-described technique, the tunnel barrier layer was prepared as the composition and flow rate of the gas supplied to the chamber were set to $Ar/O_2=10/30$ [sccm], the gas pressure was set to 1 [Pa] and the power applied to the coil was set to 200 [W]. Meanwhile, the magnetic tunnelling element prepared by this technique was inclusive of a first magnetic metal layer, made up of a NiFe layer (18.8 nm) and a Co layer (3.9 nm), a tunnel barrier layer comprised of an oxidized Al film (1.3 nm) and a second magnetic metal layer made up of a Co layer (5 nm) and an IrMn layer (15 nm).

In the technique of oxidizing the metal film by natural oxidation in atmosphere, the tunnel barrier layer was prepared by allowing the metal film to stand in atmosphere for 200 hours. Meanwhile, the magnetic tunnelling element prepared by this technique was inclusive of a first magnetic metal layer, made up of a NiFe layer (18.8 nm) and a Co layer (3.9 nm), a tunnel barrier layer comprised of an oxidized Al film (1.3 nm) and a second magnetic metal layer made up of a Co layer (2.6 nm), a NiFe layer (18.8 nm), a FeMn layer (45 nm) and a Ta layer (20 nm).

Also, in the technique of oxidizing the metal film by plasma oxidation, the tunnel barrier layer was prepared as the composition and the flow rate of the gas supplied to the chamber was set to $Ar/O_2=40/4$ [sccm], the gas pressure was set to 0.3 [Pa], the power applied to the coil and the metal film was 20 [W] and the oxidization time was set to 1000 [sec]. Meanwhile, the magnetic tunnelling element prepared by this technique was inclusive of a first magnetic metal layer, made up of a NiFe layer (18.8 nm) and a Co layer (3.9 nm), a tunnel barrier layer of an oxidized Al film (1.3 nm) and a second magnetic metal layer made up of a Co layer (2.6 nm), a NiFe layer (18.8 nm), a FeMn layer (45 nm) and a Ta layer (20 nm).

Figure 5:
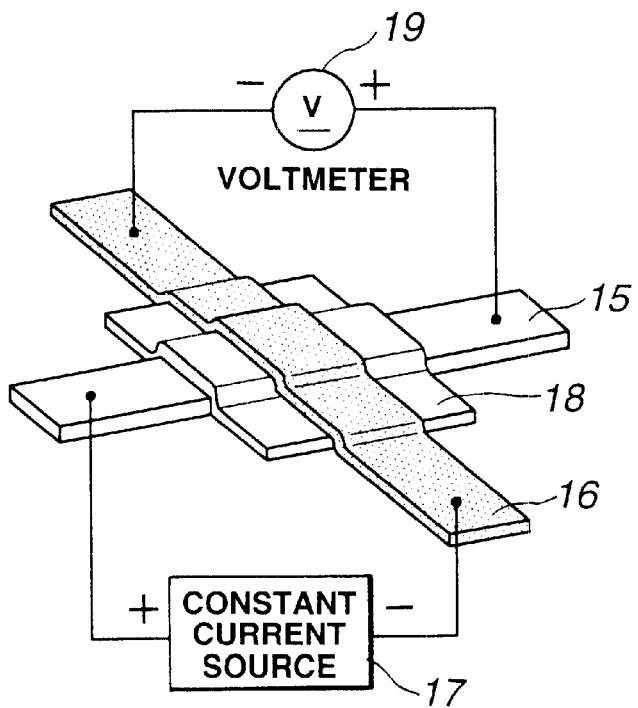
FIG. 5 is a schematic view showing an arrangement of an experiment for verifying the effect of an inventive technique and a conventional technique.

On the respective magnetic tunnelling elements, manufactured by the different techniques, as described above, experiments for measuring the resistance value of the tunnel barrier layer were conducted, as shown in FIG. 5. In these experiments, the resistance values of the tunnel barrier layer were measured by measuring the voltage value of a sample 18 held by a first electrode 15 connected to the first magnetic metal layer and a second electrode 16 connected to the second magnetic metal layer by a voltmeter 19 as a predetermined current was supplied from a constant current source 17 to the first electrode 15 and the second electrode 16. If, as a result of the experiments, the resistance value of the tunnel barrier layer of the sample 18 is not higher than 1 Ω, that sample 18 was rejected as short circuit. The results of the experiments are shown in Table 1:

TABLE 1

| methods of oxidation | rate of occurrence of rejects |
| --- | --- |
| inductively coupled plasma oxidization | 0% |
| natural oxidation in atmosphere | 50% |
| plasma oxidation | 25% |

As may be seen from this Table 1, if a metal film is oxidized by inductively coupled oxygen plasma, it becomes possible to prevent malfunctions of short circuit between the first magnetic metal layer and the second magnetic metal layer to produce an extremely high production yield. Conversely, should the metal film be oxidized by natural oxidation in atmosphere or plasma oxidation, film defects are produced in the tunnel barrier layer, as a result of which short circuit occurs between the first magnetic metal layer and the second magnetic metal layer to lower the production yield. From this, it has been shown that, by oxidizing the metal film by inductively coupled xygen plasma, the production yield can be markedly higher than in the conventional system.

An embodiment of the present invention in which the magnetic tunnelling element and the manufacturing method therefor explained in the foregoing are applied to an actual magnetic device is now explained. The magnetic device shown here by way of illustration is a magnetic head.

Figure 6:
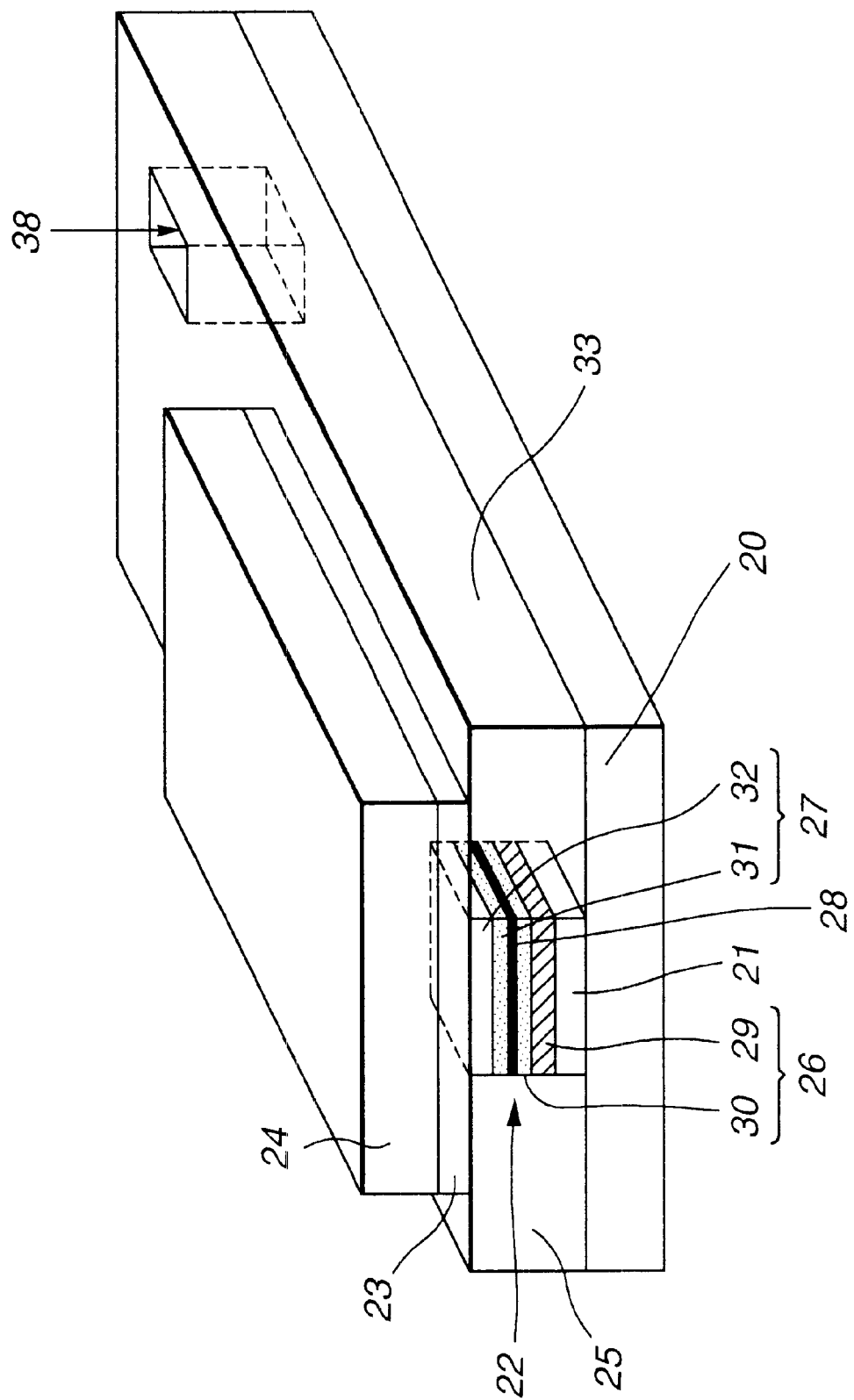
FIG. 6 s a schematic view showing the structure of a magnetic head employing a magnetic tunnelling element according to the present invention.
Figure 7:
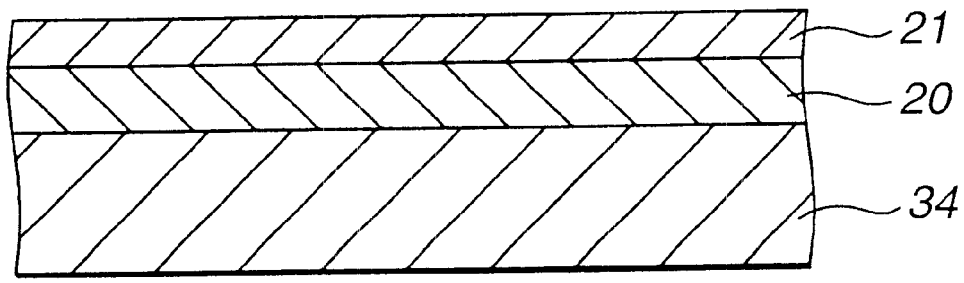
FIG. 7 shows a manufacturing process for a magnetic head having a magnetic tunnelling element and specifically the state in which a lower layer shield and a lower gap have been formed on a substrate.

Referring to FIG. 6, this magnetic head is constituted by a lower layer shield 20, a lower gap 21 formed on the lower layer shield 20, a magnetic tunnelling element 22 formed on the lower gap 21, an upper gap 23 formed on the magnetic tunnelling element 22, and an upper layer shield 24 formed on the upper gap 23. The magnetic head has its lateral side 25 as a facing surface to the magnetic recording medium and is designed so that the lower layer shield 20, magnetic tunnelling element 22, upper gap 23 and the upper layer shield 24 are exposed to this lateral side 25.

In this magnetic head, the magnetic tunnelling element 2 is constructed so that a first magnetic metal layer 26 and a second magnetic metal layer 27 are layered together through a tunnel barrier layer 28 in-between. The first magnetic metal layer 26 is made up of a NiFe layer 29 and a Co layer 30, while the second magnetic metal layer 27 is made up of a Co film 31 and an IrMn film 32. The tunnel barrier layer 28 is formed by oxidizing the Al film by inductively coupled oxygen plasma.

Moreover, in this magnetic head, the lower gap 21 and the magnetic tunnelling element 22 are buried in an insulating layer 33 formed of an insulating material.

In the above-described magnetic head, the lower layer shield 20 and the upper layer shield 24 are formed of an electrically conductive magnetic material. By so doing, the lower layer shield 20 and the upper layer shield 24 are able to induce the magnetic field other than the signal magnetic field applied to the lateral side 25. Thus, it is possible with the present magnetic head to lead only the signal magnetic field to the magnetic tunnelling element 22.

The lower gap 21 and the upper gap 23 are formed of an electrically conductive non-magnetic material. By so doing, the first magnetic metal layer 26 can be magnetically isolated from the lower layer shield 20, while the second magnetic metal layer 27 can similarly be magnetically isolated from the upper layer shield 24. That is, with the lower gap 21, the magnetic tunnelling element 22 can be not coupled magnetically with the lower layer shield 20 formed of the magnetic material. On the other hand, with the upper gap 23, the magnetic tunnelling element 22 can be not coupled magnetically with upper layer shield 24 formed of the magnetic material.

Moreover, with the present magnetic head, since the lower layer shield 20, lower gap 21, upper gap 23 and the upper layer shield 24 are formed of an electrically conductive material, the lower layer shield 20 and the lower gap 21 prove an electrode for the first magnetic metal layer 26, whilst the upper gap 23 and the upper layer shield 24 prove an electrode for the second magnetic metal layer 27.

With the above-described magnetic head, the first magnetic metal layer 26 has a free magnetization film exhibiting uniaxial anisotropy in substantially the perpendicular direction to the signal magnetic field applied from the magnetic recording medium, whilst the second magnetic metal layer 27 has a pinned magnetization film having pinned magnetization in a direction substantially parallel to the signal magnetic field applied from the magnetic recording medium. If a predetermined signal magnetic field is applied to the magnetic head, the direction of magnetization of the free magnetization film is changed. Specifically, with the present magnetic head, the NiFe layer 29 and the Co film 31 represent a free magnetization film and a pinned magnetization film, respectively.

In the magnetic head, there flows a constant current from the second magnetic metal layer 27 to the first magnetic metal layer 26. This causes the so-called tunnel current to flow between the second magnetic metal layer 27 and the first magnetic metal layer 26. With the present magnetic head, if the direction of magnetization of the free magnetization film (NiFe layer 29) of the first magnetic metal layer 26 is changed to change the relative angle between it and the direction of magnetization of the pinned magnetization film (Co film 31), the resistance value to the tunnel current is changed.

Thus, with the present magnetic head, the resistance value of the tunnel current can be measured by detecting the voltage of the constant current flowing between the second magnetic metal layer 27 and the first magnetic metal layer 26. With the present magnetic head, the signal magnetic field from the magnetic recording medium can be detected by measuring changes in the resistance value of the tunnel current.

For manufacturing the magnetic head, constructed as described above, the lower layer shield 20, formed of a magnetic material, such as sendust, and the lower gap 21, formed of a non-magnetic metal material, are formed on a major surface 34 of, for example, AlTiC or TiO-CaO, commonly used for a thin-film magnetic head. The lower gap 21 is under the magnetic tunnelling element 22 and hence is desirably formed as a highly planar surface.

Figure 8:
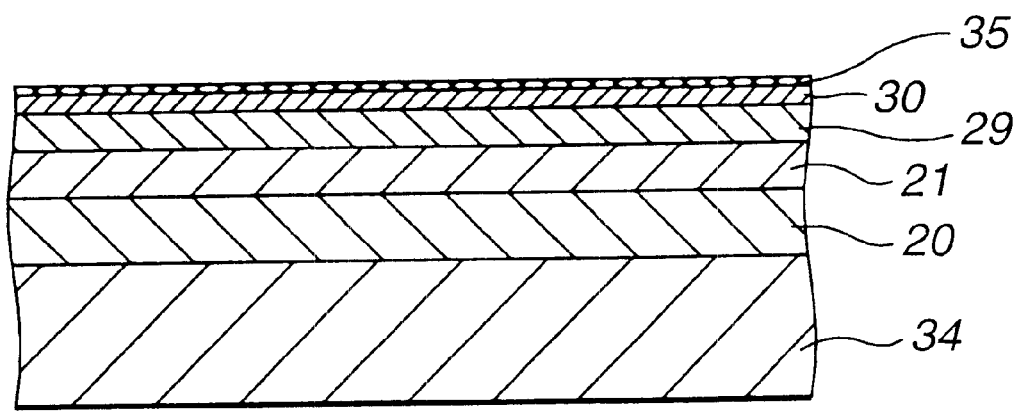
FIG. 8 shows a manufacturing process for a magnetic head having a magnetic tunnelling element and specifically the state in which a NiFe film, a Co film and an Al film have been formed on the lower gap.

Then, a NiFe layer 29, 18.8 nm in thickness, a Co film 30, 3.9 nm in thickness and an Al film, 1.3 nm in thickness, are formed in this order on the lower gap 21, as shown in FIG. 8. The NiFe layer 29 and the Co film 30 are processed with orientation processing so as to have a uniaxial anisotropy in a substantially perpendicular direction with respect to the magnetic field applied from the magnetic recording medium.

Figure 3:
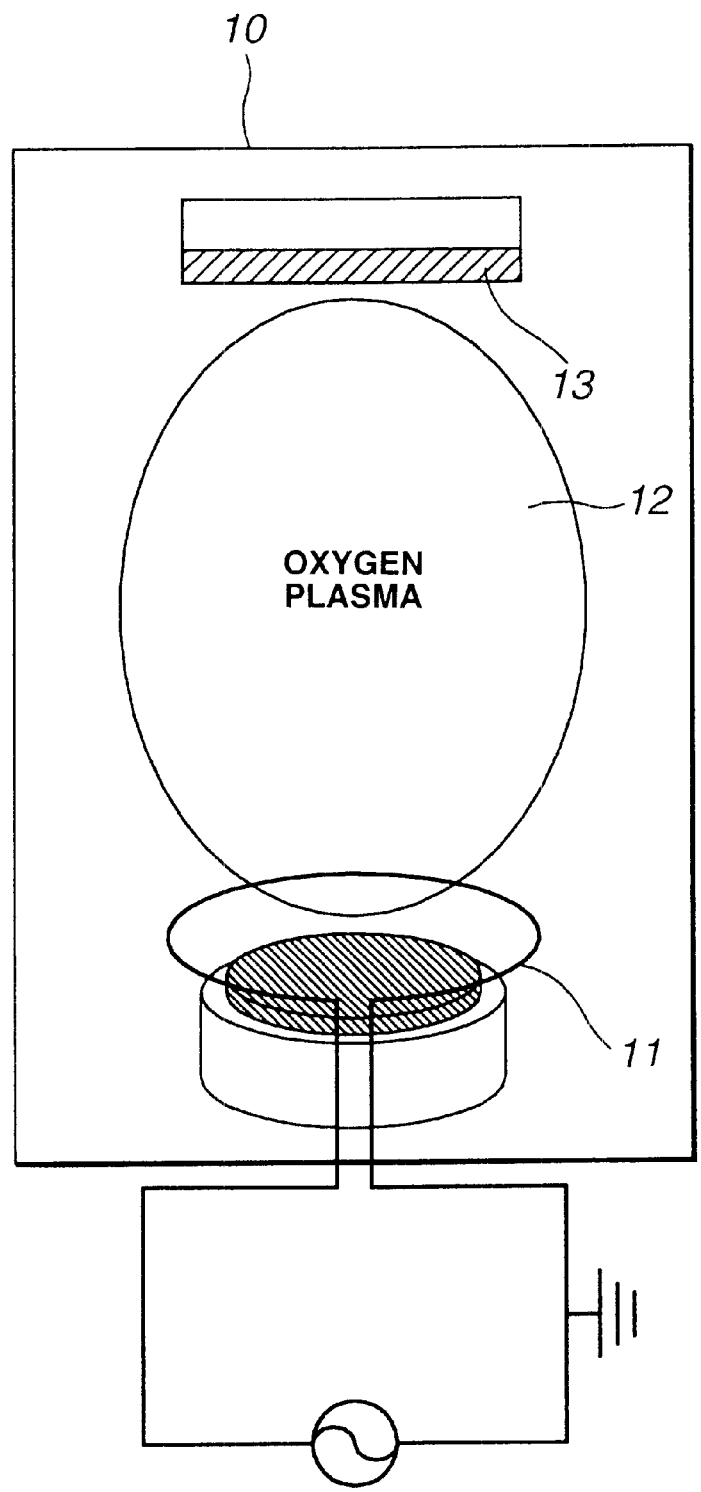
FIG. 3 is a schematic view for illustrating the system of oxidizing a metal film by an inductively coupled oxygen plasma in forming a tunnel barrier layer.

An Al film 35 then is oxidized in a chamber shown in FIG. 3 with an inductively coupled oxygen plasma. At this time, the Al film is controlled in its oxidation by suitably adjusting e.g., the oxidation time, oxygen partial pressure, ratio frequency power or gas pressure. The forming processes for the above-mentioned respective films, oxidation processes for the Al film 35 and the film-forming processes, as later explained, are desirably carried out in the same chamber.

Figure 9:
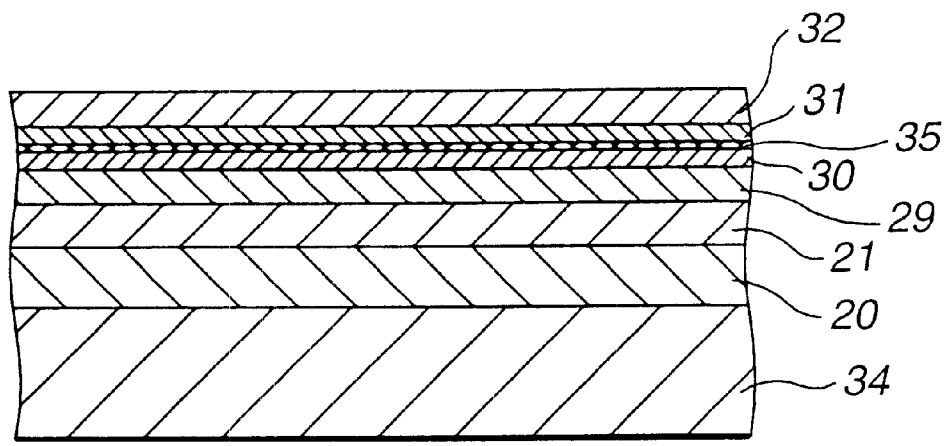
FIG. 9 shows a manufacturing process for a magnetic head having a magnetic tunnelling element and specifically the state in which, after oxidizing the Al film, a Co film, a Co film and an IrMn film have been formed on the Al film.

On the oxidized Al film 35, the Co film 31 and the IrMn film 32 are formed in this order, as shown in FIG. 9. The IrMn film 32 is processed with orientation processing so that an exchange coupling magnetic field will be generated between it and the Co film 31 in a direction substantially parallel to the magnetic field applied from the magnetic recording medium.

Figure 10:
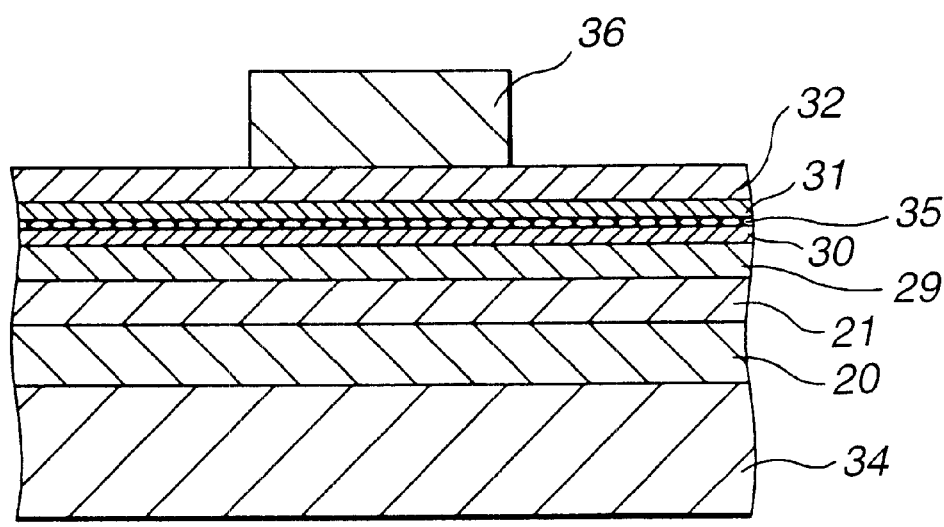
FIG. 10 shows a manufacturing process for a magnetic head having a magnetic tunnelling element and specifically the state in which a resist pattern has been formed.

Then, a photoresist routing film is formed on the IrMn film 32 and it, is patterned by a photolithographic technique to form a photoresist pattern 36 of a predetermined shape, as shown in FIG. 10. Specifically, the photoresist pattern 36 protest the magnetic tunnelling element 22.

Figure 11:
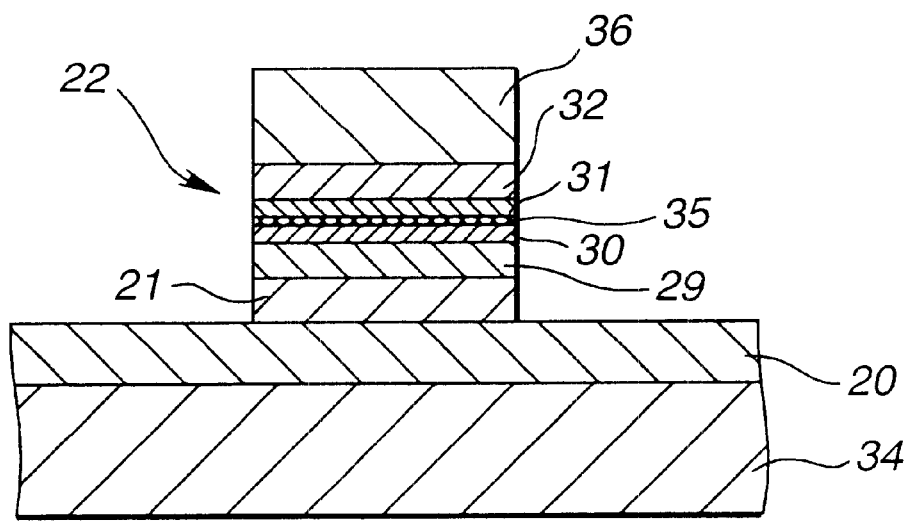
FIG. 11 shows a manufacturing process for a magnetic head having a magnetic tunnelling element and specifically the state in which a magnetic tunnelling element has been formed by etching.
Figure 12:
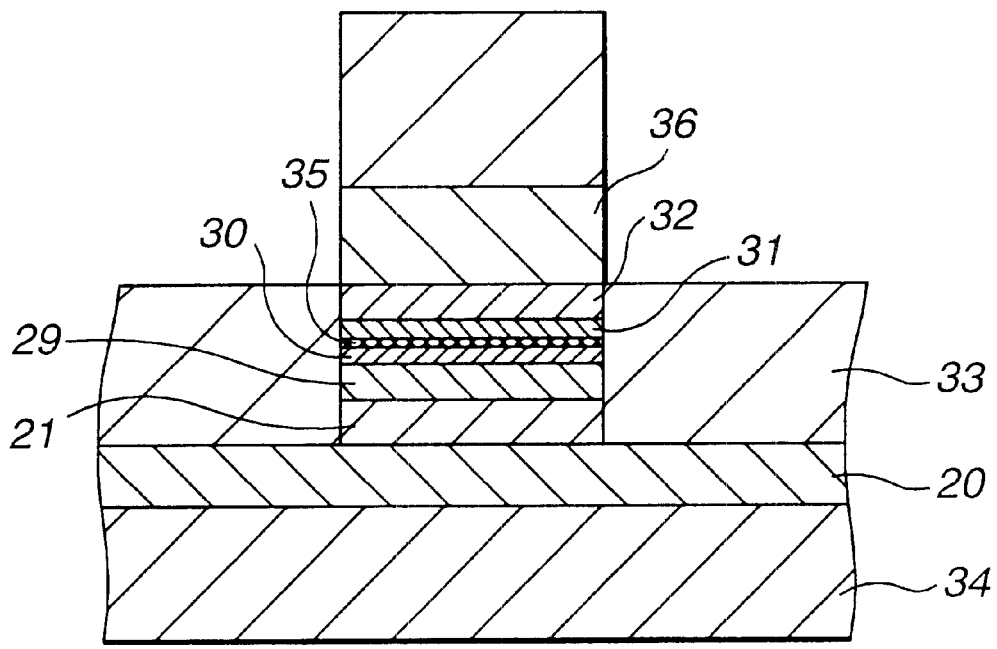
FIG. 12 shows a manufacturing process for a magnetic head having a magnetic tunnelling element and specifically the state in which an insulating film has been formed.
Figure 13:
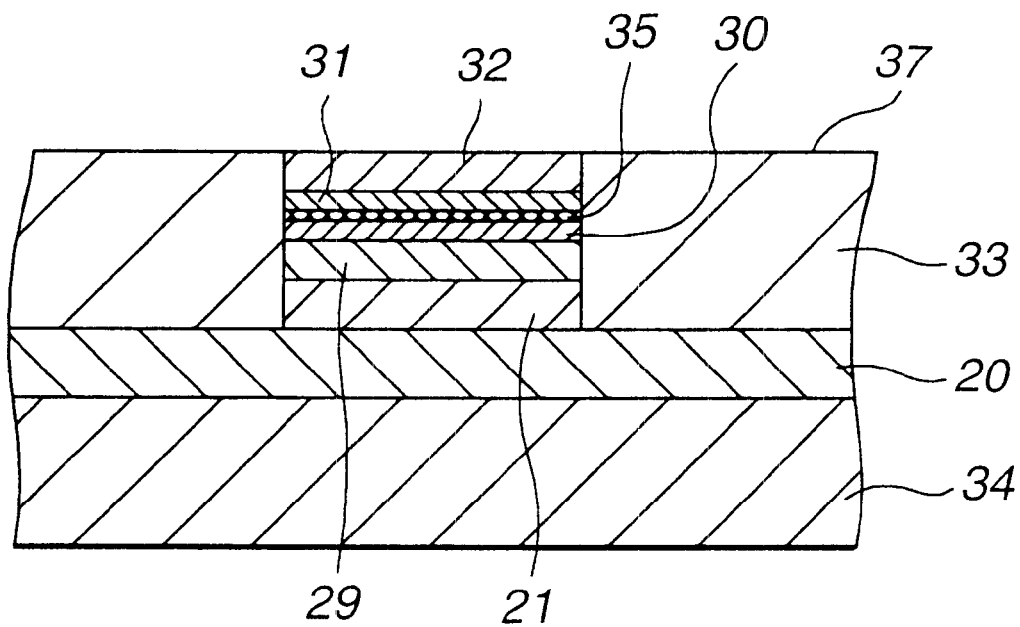
FIG. 13 shows a manufacturing process for a magnetic head having a magnetic tunnelling element and specifically the state in which the device surface has been planarized after removing the resist pattern.

The film is etched in an area not protecting the photoresist pattern 36, by a technique, such as Ar ion milling, until the lower layer shield 20 is exposed, as shown in FIG. 11. In this manner, the lower gap 21, NiFe layer 29, Co film 30, oxidized Al film 35, Co film 31, IrMn film 32 and the photoresist pattern 36 are left on the lower layer shield 20. That is, the magnetic tunnelling element 22 of a predetermined shape is formed under the photoresist pattern 36.

The insulating layer 33, formed of an insulating material, such as $Al_2O_3$, is then formed on the lower layer shield 20 and on the photoresist pattern 36, exposed to outside, as the photoresist pattern 36 is still left over. This insulating layer 33 is formed on the lower layer shield 20 so that the insulating layer 33 will be at the same height level as the interface between the photoresist pattern 36 and the IrMn film 32.

The photoresist pattern 36 and the insulating layer 33 formed thereon are removed by e.g., an organic solvent.

The upper gap 23 of, for example, a non-magnetic material, such as Ta, is formed on the major surface 37, and a magnetic head shown in FIG. 6 is formed by forming the upper layer shield 24 to a predetermined shape. The upper layer shield 24 may be formed by a plating method forming the photoresist pattern of the predetermined shape or by forming the upper layer shield 24 on the entire surface of the upper gap 23 by sputtering and subsequently etching the upper layer shield 24.

The insulating layer 33, lower gap 21 and the lower layer shield 20 are formed to a predetermined shape by photolithography and etching and an opening 38 is bored in the insulating layer 33 to enable electric connection with the lower layer shield 20. An opening 38 is formed in the insulating layer 33 to expose the lower layer shield 20 via the opening 38. An electrically conductive material is charged into the opening 38, in a manner not shown, to enable electric connection of the lower layer shield 20.

With the magnetic head, thus manufactured, the Al film 35 is oxidized, using the inductively coupled oxygen plasma, to form the tunnel barrier layer 28. Thus, with the present magnetic head, the tunnel current flows reliably between the first magnetic metal layer 26 and the second magnetic metal layer 27. Stated differently, the tunnel barrier layer 28 can be reliably formed by the above technique to prevent an short circuit between the first magnetic metal layer 26 and the second magnetic metal layer 27 to improve the production yield at the time of manufacture of the magnetic head.

What is claimed is:

1. A method for manufacturing a magnetic tunnelling element comprising:

forming a first magnetic layer, wherein the first magnetic layer includes a first Co layer and a free magnetization layer, wherein direction of the magnetization of the free magnetization layer is susceptible to change in response to an external magnetic field;

forming a tunnel barrier layer on the first magnetic layer by oxidizing a metal film through inductively coupled Ar/oxygen plasma from a mixed atmosphere of Ar/oxygen gas; and forming a second magnetic layer over the first magnetic layer, wherein the second magnetic layer includes a pinned magnetization layer positioned against a second Co layer so as to fix a direction of magnetization of the second Co layer in a predetermined direction and wherein the tunnel barrier layer is positioned between the first Co layer and the second Co layer;

wherein the step of oxidizing the metal film includes supplying the Ar/oxygen gas at a flow rate of $Ar/O_2=$ 10/30 sccm and a pressure of 1 Pa and further includes applying 200 W of power to a coil.

2. The method of claim 1, wherein the free magnetization layer is a NiFe layer and the ratio of a thickness of the NiFe layer to the first Co layer is approximately 5 to 1.

3. The method of claim 2, wherein the pinned magnetization layer is an IrMn layer and the ratio of a thickness of the IrMn layer to the second Co layer is approximately 3 to 1.

4. The method of claim 3, wherein the ratio of the thickness of the NiFe layer to the first Co layer is 18.8 to 3.9, wherein the ratio of a thickness of the IrMn layer to the second Co layer is 15 to 5, and wherein the tunnel barrier layer includes an oxidized Al film having a thickness of 1.3 nm.

5. The method of claim 2, wherein the pinned magnetization layer includes a NiFe layer and a FeMn layer and wherein the second magnetic layer further includes a Ta layer to prohibit corrosion.

6. The method of claim 5, wherein the ratio of a thickness of the second Co layer to the NiFe layer, the FeMn layer, and the Ta layer is approximately 1 to 9 to 23 to 10.

7. The method of claim 6, wherein the thickness of the second Co layer is 2.6 nm, the thickness of the NiFe layer is 18.8 nm, the thickness of the FeMn layer is 45, and the thickness of the Ta layer is 20 nm.

8. A method for manufacturing a magnetic tunnelling element comprising:

forming a first magnetic layer, wherein the first magnetic layer includes a first Co layer and a free magnetization layer, wherein direction of the magnetization of the free magnetization layer is susceptible to change in response to an external magnetic field;

forming a tunnel barrier layer on the first magnetic layer by oxidizing a metal film through inductively coupled Ar/oxygen plasma from a mixed atmosphere of Ar/oxygen gas; and forming a second magnetic layer over the first magnetic layer, wherein the second magnetic layer includes a pinned magnetization layer positioned against a second Co layer so as to fix a direction of magnetization of the second Co layer in a predetermined direction and wherein the tunnel barrier layer is positioned between the first Co layer and the second Co layer;

wherein the step of oxidizing the metal film includes supplying the Ar/oxygen gas at a flow rate of $Ar/O_2=$ 40/4 sccm and a pressure of 0.3 Pa and further includes applying 20 W of power to a coil and setting the reaction time to 1000 seconds.

9. The method of claim 8, wherein the free magnetization layer is a NiFe layer and the ratio of a thickness of the NiFe layer to the first Co layer is approximately 5 to 1.

10. The method of claim 9, wherein the pinned magnetization layer includes a NiFe layer and a FeMn layer and wherein the second magnetic layer further includes a Ta layer to prohibit corrosion.

11. The method of claim 10, wherein the ratio of a thickness of the second Co layer to the NiFe layer, the FeMn layer, and the Ta layer is approximately 1 to 9 to 23 to 10.

12. The method of claim 11, wherein the thickness of the second Co layer is 2.6 nm, the thickness of the NiFe layer is 18.8 nm, the thickness of the FeMn layer is 45, and the thickness of the Ta layer is 20 nm.

* * * * *